United States Patent [19]

Kasanami et al.

[11] Patent Number: 5,168,805
[45] Date of Patent: Dec. 8, 1992

[54] SCREEN PRINTING METHOD AND METHOD OF PRODUCING SCREEN PRINTING PLATES

[75] Inventors: Tohru Kasanami; Shigeo Nakatsuji; Mitsuro Hamuro; Naoto Kimura, all of Kyoto, Japan

[73] Assignee: Murata Manufacturing Co., Ltd., Japan

[21] Appl. No.: 780,844

[22] Filed: Oct. 23, 1991

Related U.S. Application Data

[63] Continuation of Ser. No. 551,918, Jul. 12, 1990, abandoned.

[30] Foreign Application Priority Data

Jul. 14, 1989 [JP] Japan .................. 1-183467

[51] Int. Cl.$^5$ .................. B41C 1/14; B41M 1/12
[52] U.S. Cl. .................. 101/128.21; 101/129; 101/DIG. 36; 101/486
[58] Field of Search ........... 101/DIG. 36, 481, 486, 101/489, 128.21, 128.4, 126, 123, 129, 127, 127.1; 33/613, 614, 615, 620, 621; 355/85, 99, 113

[56] References Cited

U.S. PATENT DOCUMENTS

| | | | |
|---|---|---|---|
| 1,647,246 | 11/1927 | Ogden | 33/614 X |
| 1,828,771 | 10/1931 | Flockhart | 101/126 |
| 1,912,547 | 6/1933 | Smith et al. | 33/615 |
| 4,005,651 | 2/1977 | Sigel et al. | 101/DIG. 36 |
| 4,516,495 | 5/1985 | Ericsson | 33/614 X |

Primary Examiner—Clifford D. Crowder
Attorney, Agent, or Firm—Ostrolenk, Faber, Gerb & Soffen

[57] ABSTRACT

A screen printing method comprises an aligning process for fixing a master plate (10) to a fixing frame (20) in aligned relation thereto, an exposure process of exposing a screen printing plate (50) through the master plate (10) fixed to the fixing frame (20), a developing process for developing the thus exposed screen printing plate (50), and a printing process for printing a workpiece (80) by using the thus developed screen printing plate (50). In the aligning process, the positioning pins (22a, 22b, 22c) of the fixing frame (20) abut against the positioning protuberances (62a, 62b, 62c) of a fixing block (61). In the exposure process, the positioning pins (22a, 22b, 22c) of the fixing frame (20) abut against the positioning protuberances (32a, 32b, 32c) of a positioning block (3), while the positioning pins (52a, 52b, 52c) of the printing plate (51) holding the screen printing plate (50) abut against the positioning protuberances (62a, 62b, 62c) of the fixing block (61). In the printing process, the positioning pins (52a, 52b, 52c) of the plate frame (51) holding the screen printing plate (50) abut against the positioning protuberances (72a, 72b, 72c) of a fixing block (71). With this arrangement, the aligned state established by the aligning process which is performed first of all is maintained throughout until the last printing process is completed.

5 Claims, 7 Drawing Sheets

SCREEN PRINTING METHOD AND METHOD OF PRODUCING SCREEN PRINTING PLATES

This is a continuation of application Ser. No. 07/551,918 filed on July 12 1990, now abandoned.

BACKGROUND OF THE INVENTION

1. Field of the Invention

This invention relates to a screen printing method used in forming electrically conductive films included in electronic parts by printing, and it also relates to a method of producing printing plates and an apparatus embodying these methods.

2. Description of the Background Art

FIG. 14 shows an example of a conventional master plate. This master plate 110 is in the form of a transparent plate 111 having desired opaque master plate patterns 112 (shown hatched) formed on its surface.

Heretofore, using such master plate 110, the plate making of screen printing plates has been performed in the following manner.

As shown in FIG. 15, said master plate 110 is fixed on a fixing frame 120 by a fixing member 121, and the assembly is attached to a predetermined position on the fixing block 131 of an exposure system 130.

On the other hand, a screen printing plate 140 is prepared which comprises a screen mesh 142 spread on a plate frame 141 and a photosensitive film 143 applied to said screen mesh 142, said screen printing plate 140 being attached to a predetermined position of the movable stage 32 of the exposure system 130.

The movable stage 132 is lifted until the screen printing plate 140 is positioned close to or in contact with the master plate 110, whereupon a light source 133 is turned on for exposure.

Thereafter, the screen printing plate 140 is removed and developed, whereby the portions of the photosensitive film 143 which have not been irradiated with light are removed; thus, there is provided a screen printing plate 140 having printing patterns 144, as shown in FIG. 16.

The screen printing plate 140 obtained in this manner is used to perform a screen printing operation conventionally in the following manner.

As shown in FIG. 17, the screen printing plate 140 resulting from said plate making operation is attached to a predetermined position on the fixing block 151 of a printing machine 150 by using a stopper 152, and a thing to be printed (hereinafter referred to as the workpiece) 160 is positioned at a predetermined position on the lifting type movable stage 154 of said printing machine 150. The movable stage 154 is lifted until the workpiece 160 is opposed to the screen printing plate 140 with a predetermined clearance defined therebetween, whereupon a squeegee 156 is moved under pressure to force a paste 157 out through the printing patterns 144 of the screen printing plate 140 so as to print the surface of the workpiece 160.

In the prior art, however, there has been a problem that the scattering (variation) of the position of the printing patterns 144 on the screen printing plate 140 is as high as 1-2 mm.

The reason is that, heretofore, during exposure of the screen printing plate 140, the positioning of the master plate 110 relative to the fixing frame 120 or the positioning of the fixing frame 120 and screen printing plate 140 relative to the exposure system 130 has not been strictly effected; thus, the relative position between the master plate 110 and the screen printing plate 140 tends to scatter.

Further, in the prior art, there has been a problem that much time and labor is taken in attaching the screen printing plate 140 to the printing machine 150 and aligning it with workpiece 160.

The reason is that in addition to the fact that the scattering of the position of the printing pattern 144 on the screen printing plate 140 is very high as described above, the mechanical positioning of the screen printing plate 140 relative to the printing machine 150 is not strictly made, so that it has heretofore been necessary to perform trial printing many times.

More particularly, after trial printing of the workpiece, patterns on its surface are observed to find the necessary correction distance and the position of the screen printing plate 140 is shifted by an amount corresponding to said correction distance (in some cases, the position of the workpiece 160 will be shifted). More specifically, the position of the stopper 152 (one of which is provided in each of the X- and Y-directions) is corrected by a micrometer 153.

However, even if such correction is made, it is very difficult to increase the printing accuracy on the first trial; usually, such a trial printing and correction process has to be repeated many times, which has heretofore taken dozens of minutes or even more time.

Even with such a process, however, the positional accuracy is limited to about $\pm 100$ $\mu$m.

SUMMARY OF THE INVENTION

Accordingly, an object of the invention is to provide a screen printing method, a method of producing printing plates and an apparatus for embodying these methods, which make it possible to effect accurate printing of workpieces in a simple manner without taking as much time and labor as in the prior art.

A screen printing method according to the invention comprises:

(a) an aligning process including the steps of:
(1) preparing a master plate in the form of a transparent plate having formed on the surface thereof master plate patterns and positioning marks disposed in relative positional relation thereto, a quadrangular fixing frame for fixing said master plate and having two first positioning means on one of the two adjoining sides and one or two second positioning means on the other side, and positioning block adapted to mount said fixing frame thereon, said positioning block having a plurality of third positioning means adapted to abut against the positioning means of said fixing frame to position said fixing frame in a predetermined position, and sights for ascertaining that the master plate on the fixing frame has been positioned in a predetermined position,
(2) placing the fixing frame, with the master plate provisionally fixed thereto, on the positioning block in such a manner that said first and second positioning means abut against said third positioning means,
(3) positioning the master plate by using the sights so that the positioning marks on the master plate are positioned in a predetermined position, and
(4) thereafter effecting the final fixing of the master plate on the fixing frame;

(b) an exposure process comprising the steps of:

(1) preparing a screen printing plate which has not yet undergone complete plate making, said screen printing plate having a screen mesh spread on a quadrangular plate frame with a photosensitive film applied to said screen mesh, said plate frame having two fourth positioning means on one of the two adjoining sides and one or two fifth positioning means on the other side, (2) preparing an exposure system having a plurality of sixth positioning means adapted to abut against the first and second positioning means of the fixing frame having the master plate fixed thereto and position said fixing frame in a predetermined position and a plurality of seventh positioning means adapted to abut against the fourth and fifth positioning means of the screen printing plate to position said screen printing plate in a predetermined position, (3) attaching said fixing frame with the master plate fixed thereto and said screen printing plate to the exposure system in such a manner that their first, second, fourth and fifth positioning means abut against the sixth and seventh positioning means of said exposure system, and (4) performing exposure of said screen printing plate through the master plate;

(c) a developing process for developing the screen printing plate, which has been exposed; and (d) a printing process comprising the steps of:

(1) preparing a printing machine having a plurality of eighth positioning means adapted to abut against the fourth and fifth positioning means of the screen printing plate to position the screen printing plate in a predetermined position, (2) attaching the screen printing plate, which has been developed, to the printing machine in such a manner that its fourth and fifth positioning means abut against the eighth positioning means of said printing machine, and (3) performing the printing of workpiece.

In said aligning process, the position of the fixing frame on the positioning block is accurately determined by the fixing frame and positioning block, and also the position of the master plate relative to the fixing frame is accurately determined by the positioning marks and sights.

In said exposure process, the position of said master plate on the exposure system is accurately determined by the positioning means of said fixing frame and exposure system. The position of the screen printing plate on the exposure system is also accurately determined by the positioning means of the screen printing plate and exposure system. Therefore, there is obtained a screen printing plate whose printing pattern position is highly accurate.

In said printing process, the position of the screen printing plate on the printing machine is accurately and easily determined by the positioning means of the screen printing plate and printing machine. Therefore, highly accurate printing can be easily applied to workpieces.

Thus, according to the screen printing method of the invention, high accuracy of the printing pattern position on the screen printing plate is ensured and since such screen printing plate can be accurately and easily attached to the printing machine, highly accurate printing can be applied to workpieces easily and with good reproducibility without incurring much time and labor as in the prior art.

According to this invention, an aligning device for embodying said aligning process is provided. This aligning device comprises a quadrangular fixing frame for fixing in position a master plate in the form of a transparent plate having formed on the surface thereof master plate patterns and positioning marks disposed in relative positional relation thereto, said fixing frame having two first positioning means on one of the two adjoining sides and one or two second positioning means on the other side, and a positioning block adapted to mount said fixing frame thereon, said positioning block having a plurality of third positioning means adapted to abut against the first and second positioning means of said fixing frame to position said fixing frame in a predetermined position and sights for ascertaining that the master plate on the fixing frame has been positioned in a predetermined position by using the positioning marks.

According to the aligning device of the invention, the fixing frame for fixing the master plate and the positioning plate provided with positioning means, and the positioning block is provided with the sights; therefore, the master plate which forms the basis of said highly accurate screen printing can be positioned relative to the fixing frame accurately and easily with good reproducibility.

According to this invention, there is provided an exposure system. This exposure system which uses a quadrangular fixing frame adapted to have fixed thereto a master plate forming the basis of formation of a screen printing plate and having two first positioning means on one of the two adjoining sides and one or two second positioning means on the other side and thereby exposes a screen printing plate, which has not yet undergone complete plate making, in the form of quadrangular plate frame having third positioning means on one of the two adjoining sides and one or two fourth positioning means on the other side, said exposure system including a movable stage for mounting said screen printing plate thereon, a fixing block for fixing said fixing frame, with the master plate fixed thereto, in a position above the movable stage, said fixing block having a plurality of fifth positioning means adapted to abut against the first and second positioning means of said fixing frame to position said fixing frame in a predetermined position, and a plurality of sixth positioning means adapted to abut against the third and fourth positioning means of the screen printing plate disposed on the movable stage to position said screen printing plate in a predetermined position, and a light source for exposing the screen printing plate through the master plate.

According to the exposure system of the invention, since the fixing block is provided with positioning means associated with the fixing frame with the master plate fixed thereto and the screen printing plate, the screen printing plate which forms the basis of such highly accurate screen printing can be exposed accurately and with good reproducibility.

According to the invention, there is provided a screen printing plate which can be advantageously used in said screen printing method. This screen printing plate comprises a quadrangular plate frame having two positioning means on one of the two adjoining sides and one or two positioning means on the other side, a screen means spread on said plate frame, and printing patterns formed on said screen mesh and disposed in predetermined positional relation to the individual positioning means of the plate frame.

According to the screen printing plate of this invention, since the plate frame is provided with positioning means, it can be positioned relative to said plate frame accurately and easily and with good reproducibility.

According to this invention, there is provided a printing machine which performs printing by using said screen printing plate. This printing machine comprises a movable stage adapted to mount a workpiece thereon for positioning said workpiece in predetermined position, a fixing block for fixing said screen printing plate in a position above said movable stage and having a plurality of positioning means adapted to abut against the positioning means of the screen printing plate to position said screen printing plate in a predetermined position, and a squeegee adapted to be moved as it is pressed against the screen printing plate.

According to the printing machine of the invention, since the fixing block is provided with positioning means associated with the screen printing plate, accurate printing can be performed easily and with good reproducibility by using said screen printing plate.

As described above, positioning means are used in various positioning situations. The use of such positioning means makes it only necessary to finish the positioning surface alone with high accuracy, rather than finishing the entire area of the lateral surface (wall surface) of the fixing block, the plate frame and the like; thus, there is another advantage that machining is facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described, process after process, with reference to FIGS. 1 through 13.

Aligning process

In brief, this aligning process is used to accurately fix a master plate, which forms the basis of the formation of a screen printing plate, to a fixing frame, said aligning process employing a master plate 10, a fixing frame 20 and an aligning device 40 including said fixing frame 20, to be described below.

Figure 1:
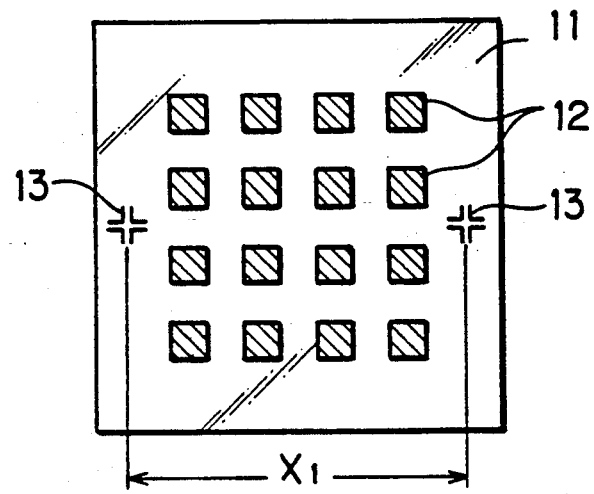
FIG. 1 is a plan view showing a master plate used in an embodiment of the invention.

The master plate 10, as shown in FIG. 1, is in the form of a transparent plate 11 having formed on the surface thereof desired master plate patterns 12 (shown hatched), and two double crisscross positioning marks 13. The master plate patterns 12 and positioning marks 13 are usually formed at the same time by using a single mask; therefore, their relative positional accuracy is very high.

The transparent plate 11 is made, for example, of transparent glass or organic film.

The master plate patterns 12 are opaque in this example. The shape and number of said master plate patterns 12 are not limited to the illustration but rather are optional.

Figure 2:
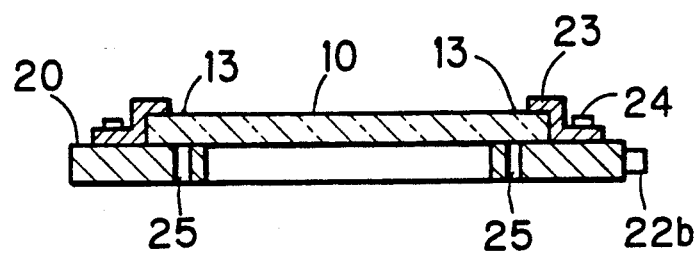
FIG. 2 is a sectional view showing the master plate of FIG. 1 attached to a fixing frame.
Figure 3:
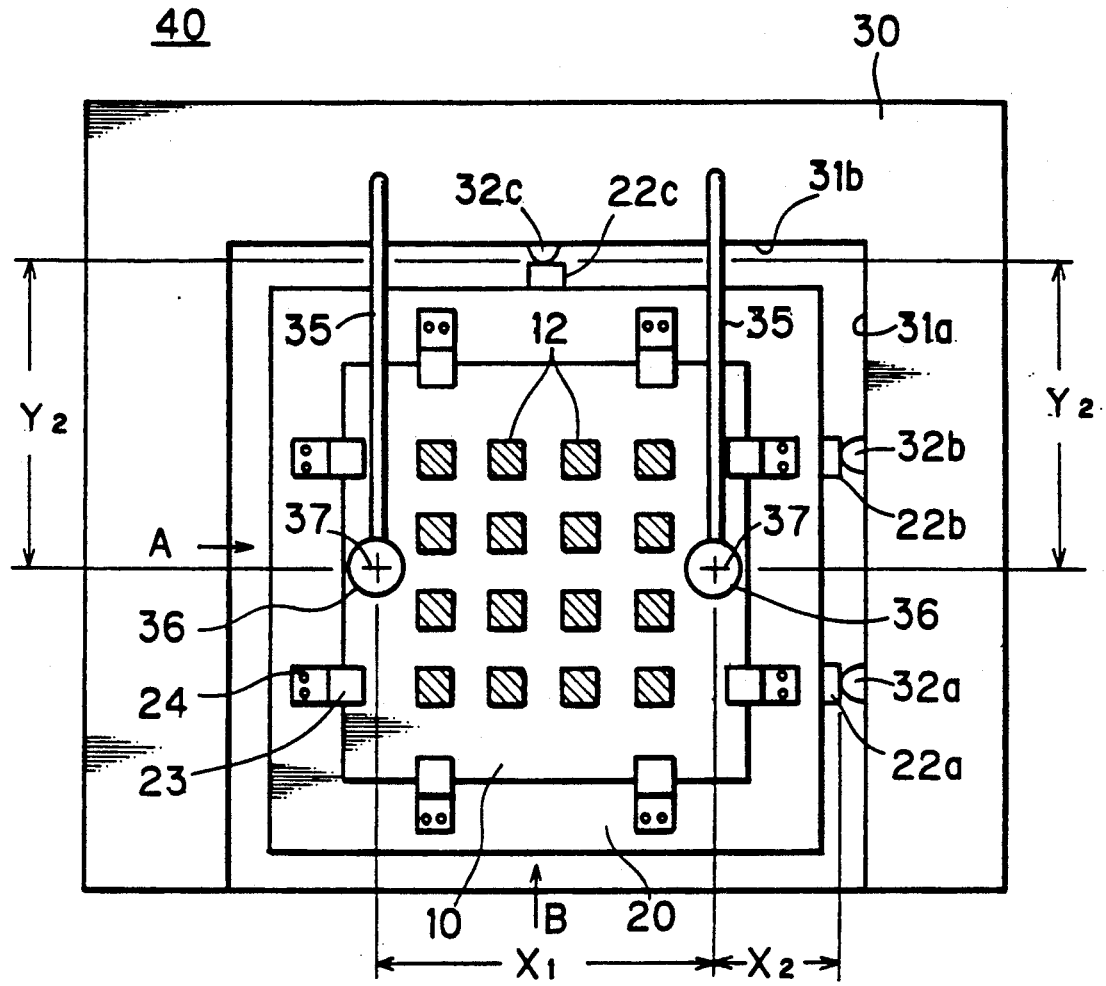
FIG. 3 is a plan view showing an aligning device used in the embodiment.

The fixing frame 20, as shown in FIGS. 2 and 3, is quadrangular and serves to fix the master plate 10 in position, having positioning means in the form of two positioning pins 22a and 22b on one of the two adjoining sides and a single positioning pin 22c on the other side.

The front surfaces of these positioning pins 22a through 22c are finished so that positioning to be later described can be effected accurately. Further, the front surfaces of the positioning pins 22a and 22b are located in the same plane, while the front surface of the positioning pin 22c is located in a plane which is orthogonal to the first-mentioned plane.

The upper surface of the fixing frame 20 is provided with fixing elements 23 and bolts 24 for fixing the master plate 10 in position.

Further, the fixing frame 20 is formed with two through-holes 25 so that the positioning marks 13 on the fixed master plate 10 can be seen through the master plate 10 from the opposite side.

Figure 4:
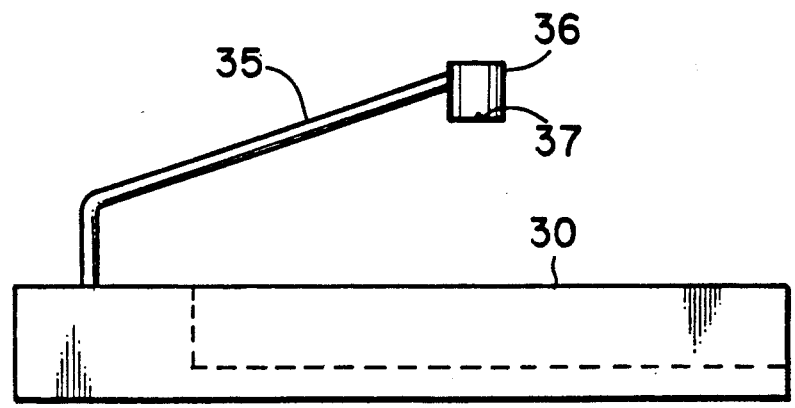
FIG. 4 is a side view of the positioning block of FIG. 3 and its surroundings.

The aligning device 40 is composed of a combination of the fixing frame 20, and a positioning block 30 as shown in FIGS. 3 and 4.

The positioning block 30 is used to mount thereon the fixing frame 20 with the master plate 10 fixed thereto and has positioning means in the form of three positioning protuberances 32a, 32b and 32c on its adjoining wall surfaces 31a and 31b orthogonal to each other, said protuberances being adapted to abut against the positioning pins 22a through 22c so as to accurately position the fixing frame 20 in a predetermined position.

The front ends of the positioning protuberances 32a through 32c are finished so that the positioning to be later described can be accurately effected. Further, the front ends of the positioning protuberances 32a and 32b are located in the same plane and the front end of the positioning protuberance 32c is located in a plane which is orthogonal to the first-mentioned plane.

Installed on the positioning block 30 are two sights 36 supported by arms 35 for accurately positioning the master plate 10, disposed on the fixing frame 20, in a predetermined position by using the positioning marks 13.

Figure 5:
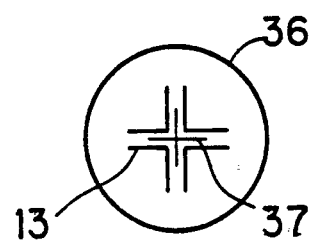
FIG. 5 is a view showing what is seen through a sight of FIG. 3.

Each sight 36 is in the form of a lens formed with a crisscross mark 37 shown in FIG. 5. The positions of the two marks 37 relative to the positioning block 30 are strictly determined.

Let $X_2$ be the distance from the front ends of the positioning protuberances 32a and 32b to one mark 37 (the one at right in FIG. 3) as measured in the X-axis direction and $Y_2$ be the distance from the front end of the positioning protuberance 32c to each mark 37 in the Y-axis direction. Further, let $X_1$ be the distance between the centers of the two positioning marks 13 on the master plate 10, and the distance between the two marks 37 in the X-axis direction will also be $X_1$.

The fixing of the master plate 10 on the fixing frame 20 is effected in the following procedure.

First, the master plate 10 is provisionally fixed on the fixing frame 20 without tightening the bolts 24. In this state, the fixing frame 20, as shown in FIG. 3, is installed on the positioning block 30 while applying weak forces to the fixing frame 20 in the two directions of arrows A and B until the positioning pins 22a through 22c on the fixing frame 20 abut against the positioning protuberances 32a through 32c on the positioning block 30. Thereby, it follows that the fixing frame 20 has been accurately set relative to the positioning block 30.

Subsequently, with the fixing frame 20 left in said state, the operator looks through each sight 36 while shifting the position of the master plate 10 so that, as shown in FIG. 5, each positioning mark 13 on the master plate 10 coincides with the mark 37 of the sight 36. Upon completion of the positioning, the bolts 24 are fully tightened to fix the master plate 10 on the fixing frame 20.

Thereby, it follows that the master plate 10 has been accurately fixed in a predetermined position on the fixing frame 20 and hence that the master plate patterns 12 on the master plate 10 have been accurately positioned in a predetermined position relative to the front end surfaces of the positioning pins 22a through 22c. In this case, the distance between the front end surfaces of the positioning pins 22a and 22b and one positioning mark 13 (the one at right in FIG. 3) in the X-axis direction is $X_2$, and the distance between the front end surface of the positioning pin 22c and the positioning marks 13 in the Y-axis direction is $Y_2$.

With the above, the aligning process is completed and the operation goes to the exposure process.

Exposure process

In brief, this exposure process and apparatus is designed for accurate exposure of a screen printing plate by using the master plate 10 accurately fixed to the fixing frame 20 in the manner described above, and uses a screen printing plate 50 which has not yet undergone complete plate making and an exposure system 60.

Figure 6:
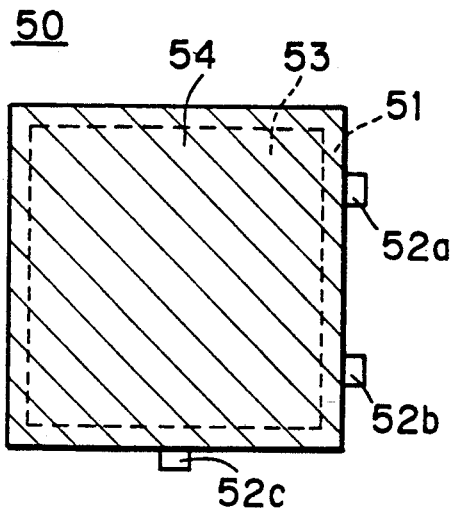
FIG. 6 is a plan view showing an example of a screen printing plate which has not yet undergone complete plate making.
Figure 7:
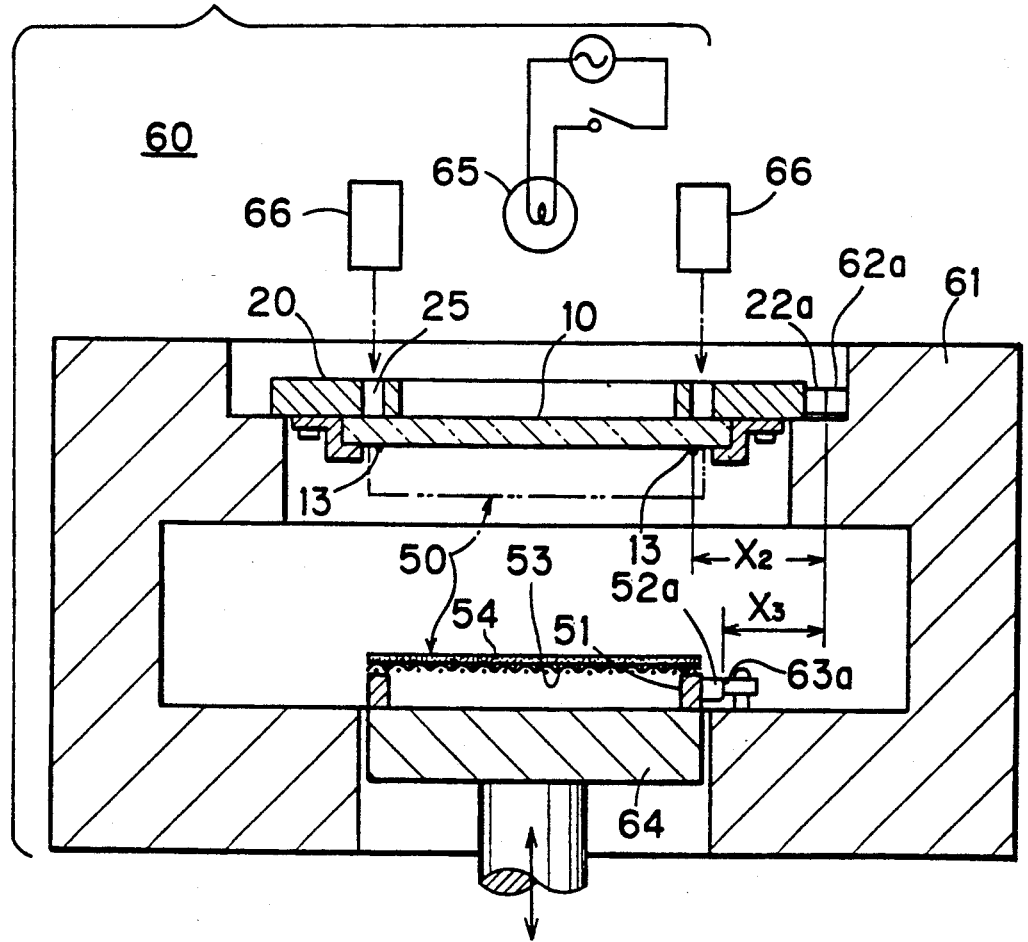
FIG. 7 is a sectional view of an exposure system used in the embodiment.

The screen printing plate 50, as shown in FIGS. 6 and 7, is in the form of a quadrangular plate frame 51 having a screen mesh 53 spread thereon with a photosensitive film (for example, a photosetting resin film) 54 (shown hatched) applied to said screen mesh 53. The plate frame 51 is provided with two positioning pins 52a and 52b on one of the two adjoining sides and a single positioning pin 52c on the other side.

The front end surfaces of the positioning pins 52a through 52c are finished so that the positioning to be later described can be accurately effected. The front end surfaces of the positioning pins 52a and 52b are located in the same plane and the front end surface of the positioning pin 52c is located in a plane orthogonal to the first-mentioned plane.

The exposure system 60 comprises a lifting type movable stage 64 adapted to mount said screen printing plate 50 thereon, a fixing block 61 for fixing frame 20, with the master plate 10 fixed thereto, in a position above the movable stage 64 with said master plate 10 turned downward, and a light source (for example, a lamp) 65 for irradiating the screen printing plate 50 through the master plate 10.

Figure 8:
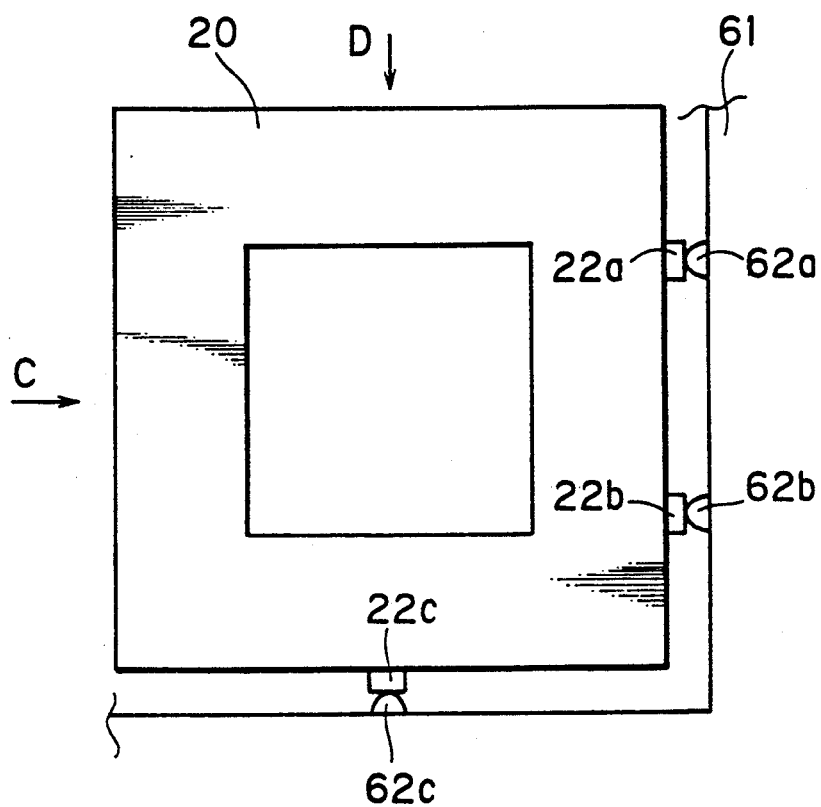
FIG. 8 is a schematic plan view showing the positions of positioning protuberances in the upper part of the apparatus of FIG. 7.
Figure 9:
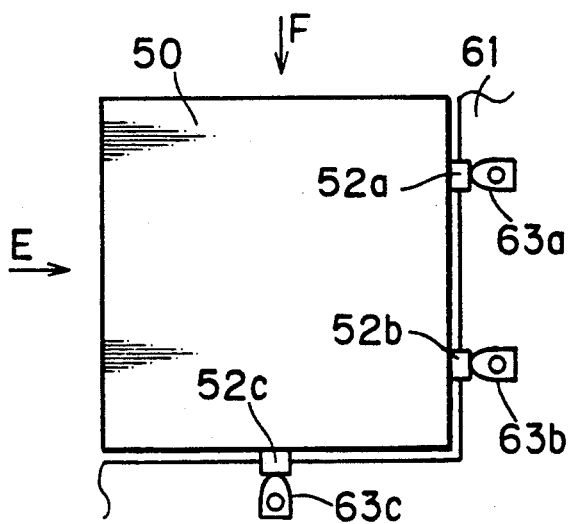
FIG. 9 is a schematic plan view showing the positions of positioning protuberances in the lower part of the apparatus of FIG. 7.

The fixing block 61 is provided in the upper portion thereof with positioning means, also shown in FIG. 8, in the form of three positioning protuberances 62a, 62b and 62c adapted to abut against the positioning pins 22a through 22c of the fixing frame 20 so as to position the fixing frame 20 and hence the master plate 10 in a predetermined position. The lower portion of the fixing block 61 has positioning means, also shown in FIG. 7 and FIG. 9, in the form of three positioning protuberances 63a, 63b and 63c adapted to abut against the positioning pins 52a through 52c of the screen printing plate 50 disposed on the movable stage 64 so as to position the screen printing plate 50 in a predetermined position.

The front end surfaces of the positioning pins 62a through 62c are finished so that the positioning to be later described can be accurately effected. The front end surfaces of the positioning pins 62a and 62b are located in the same plane and the front end surface of the positioning pin 62c is located in a plane orthogonal to the first-mentioned plane.

Further, the front end surfaces of the positioning pins 62a through 62c are finished so that the positioning to be later described can be accurately effected. The front end surfaces of the positioning pins 63a and 63b are located in the same plane which is parallel with the plane in which said positioning protuberances 62a and 62b are located, and the front end surface of the positioning protuberance 63c is located in a plane orthogonal to the first-mentioned plane.

The exposure of the screen printing plate 50 is performed in the following procedure.

First, the fixing frame 20 with the master plate 10 fixed thereto is installed on the fixing block 61 with the master plate 10 turned downward while applying weak forces to the fixing frame 20 in the directions of arrows C and D (see FIG. 8) until the positioning pins 22a through 22c abut against the positioning protuberances 62a through 62c. Thereby, it follows that the fixing frame 20 and hence the master plate 10 have been accurately set relative to the fixing block 61. That is, it follows that the master plate patterns 12 on the master plate 10 have been accurately positioned in a predetermined position relative to the front ends of the positioning protuberances 62a through 62c of the fixing block 61. In this case, the distance in the X-axis direction between the front ends of the positioning protuberances 62a and 62b and one positioning mark 13 (the one at right in FIG. 7) is the aforesaid $X_2$, and the distance in the Y-axis direction between the front end of the positioning protuberances 62c and the positioning marks 13 is the aforesaid $Y_2$.

In addition, in the case where stricter positioning of the master plate 10 is required, two sights 66 similar to said sights 36 may be provided in a predetermined position above the fixing block 61, as shown in FIG. 7. Thus, the operator looks through them to locate the positioning marks 13 of the master plate 10 through the through-holes 25 of the fixing frame 20 so as to finely adjust the position of the fixing frame 20 and hence the master plate 10.

Subsequent to (or prior to) this setting of the fixing frame 20, the screen printing plate 50 is installed on the movable state 64 while applying weak forces to the screen printing plate 50 in the two directions of arrows E and F (see FIG. 9) until the positioning pins 52a through 52c abut against the positioning protuberances 63a through 63c. Thereby, it follows that the screen printing plate 50 has been accurately set on the movable stage 64.

In this case, the distance $X_3$ in the X-axis direction (FIG. 7) between the front ends of the positioning protuberances 62a and 62b and the front ends of the positioning protuberances 63a and 63b, and the distance $Y_3$ (not seen in the figures) in the Y-axis direction between the front end of the positioning protuberance 62c and the front end of positioning protuberance 63c are determined so that the master plate 10 on the fixing frame 20 and the screen printing plate 50 which have respectively been set as described above are in a predetermined positional relation to each other.

Therefore, when the master plate 10 fixed on the fixing frame 20 and the screen printing plate 50 have been set on the fixing block 61 as described above, it follows that the master plate 12 on the master plate 10 have been accurately positioned in a predetermined position relative to the screen printing plate 50.

Subsequently, in the above state, the movable stage is lifted to bring the photosensitive film 54 of the screen printing plate 50 close to or in contact with the master plate, whereupon the light source 65 is turned on to effect the exposure of the screen printing plate 50.

At this time, since the master plate patterns 12 on the master plate 10 (see FIG. 1) shield the light from the light source 65, the portions of the photosensitive film 54 corresponding to said master patterns 12 are not irradiated with the light; therefore, they do not photo-cure.

In that case, the positional accuracy of the portions not having photocured (the portions which are to become printing patterns 55 after development to be later described) relative to the front end surfaces of the positioning pins 52a through 52c is very good as a result of the exposure being effected by said positioning means; for example, the positional accuracy can be about ±10 μm.

Thereafter, the screen printing plate 50 is removed from the movable stage 64 and transferred to the developing process which follows.

Developing process

In this developing process, the screen printing plate 50 is immersed in a developing solution. Thereupon, the uncured portions of the photosensitive film 54 not irradiated with light are removed, with the other portions remaining intact.

Figure 10:
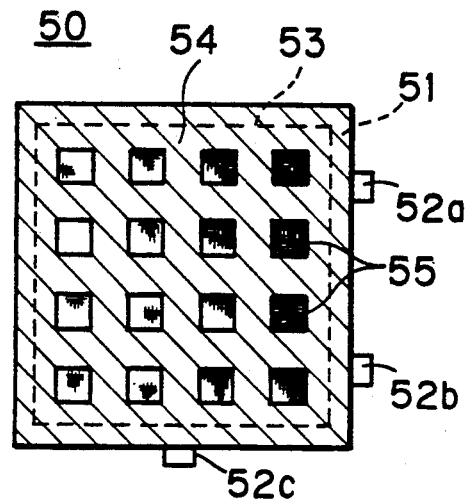
FIG. 10 is a plan view of the screen printing plate which has undergone complete plate making, used in the embodiment.

The screen printing plate 50 thus produced (thus having undergone complete plate making) is shown in FIG. 10. In this figure, the numeral 55 denotes printing patterns where no portions of the photosensitive film 54 remain.

The positional accuracy of the printing patterns 55 relative to the front end surfaces of the positioning pins 52a through 52c is very good, being about ±10 μm, as described above.

Furthermore, since said positioning means provide high positional reproducibility, no matter how many screen printing plates 50 may be fabricated, the positional accuracy of the printing patterns 55 can be about ±10 μm.

Printing process

In brief, this printing process, using said accurately produced screen printing plate 50, performs accurate printing of workpieces, and uses a printing machine 70 described below.

Figure 11:
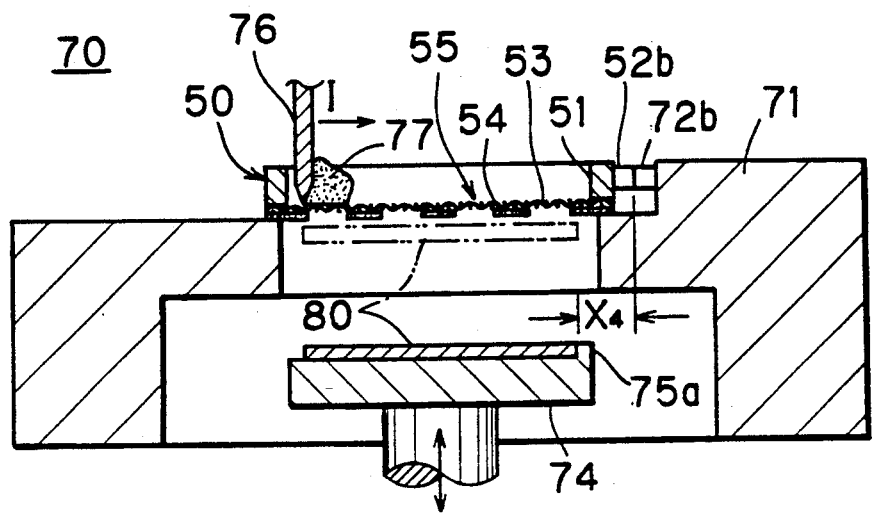
FIG. 11 is a sectional view showing a printing machine used in the embodiment.

The printing machine 70, as shown in FIG. 11, comprises a lifting type movable stage 74 for mounting a workpiece 80 thereon, a fixing block 71 for fixing said screen printing plate 50, which has undergone complete plate making, in a position above the movable stage 74 with the screen mesh 53 turned upward, and a squeegee 76 adapted to be moved as it is pressed against the screen printing plate 50.

Figure 12:
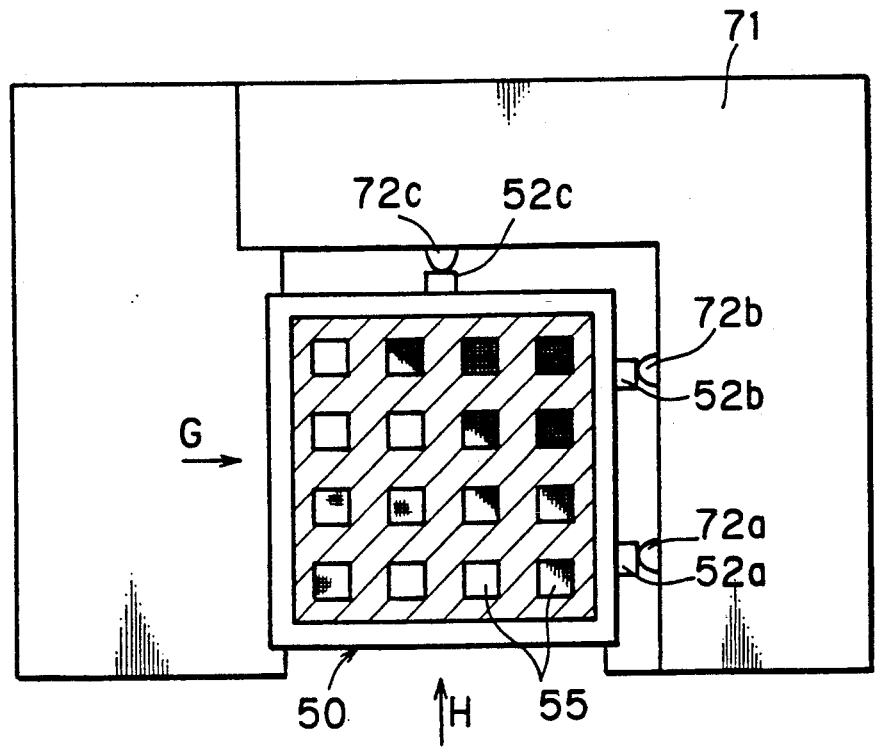
FIG. 12 is a plan view of the printing machine of FIG. 11.
Figure 14:
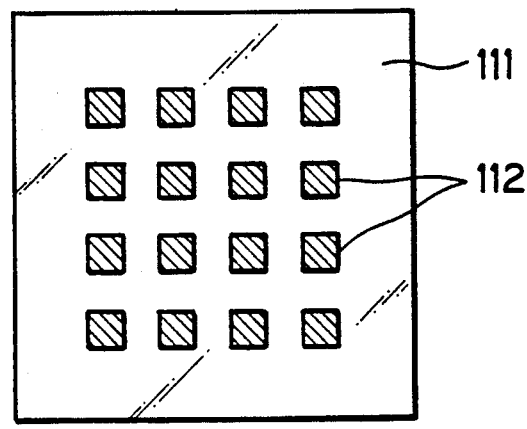
FIG. 14 is a plan view showing an example of a conventional master plate.
Figure 15:
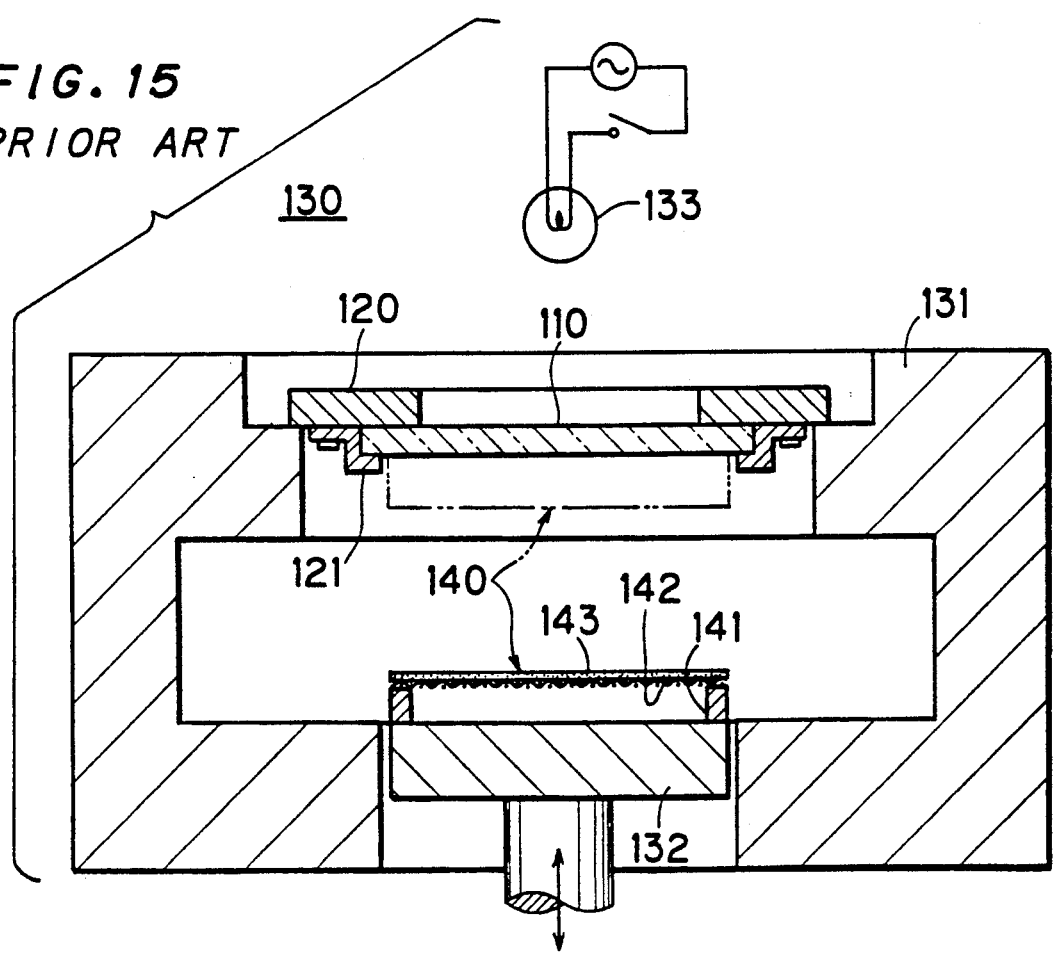
FIG. 15 is a sectional view showing an example of a conventional exposure system.
Figure 16:
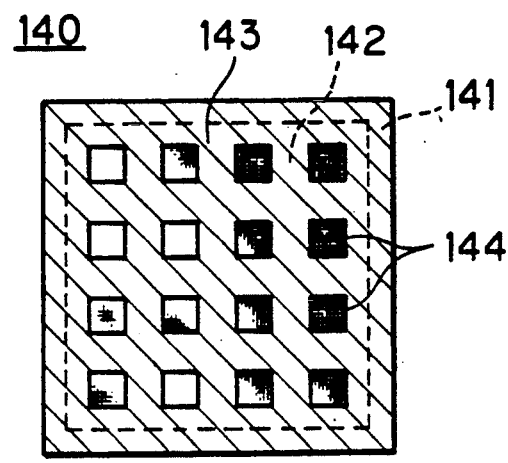
FIG. 16 is a plan view showing an example of a conventional screen printing plate which has undergone complete plate making.
Figure 17:
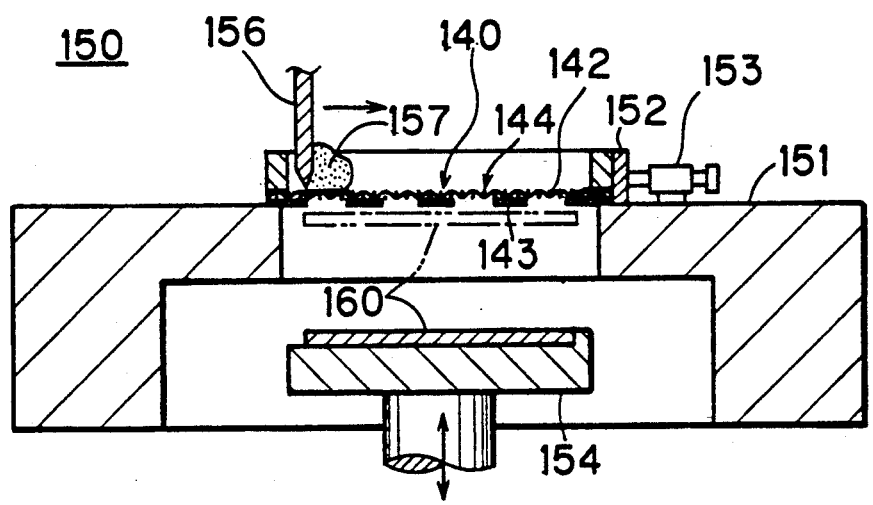
FIG. 17 is a sectional view showing an example of a conventional printing machine.

The fixing block 71, as shown in FIG. 12 also, is provided with positioning means in the form of three positioning protuberances 72a, 72b and 72c adapted to abut against the positioning pins 52a through 52c of the screen printing plate 50 as to position the screen printing plate 50 in a predetermined position.

The front ends of the positioning protuberances 72a through 72c are finished to ensure accurate positioning to be later described. Further, the front ends of the positioning protuberances 72a and 72b are located in the same plane and the front end of the positioning protuberance 72c is located in a plane which is orthogonal to the first-mentioned plane.

Figure 13:
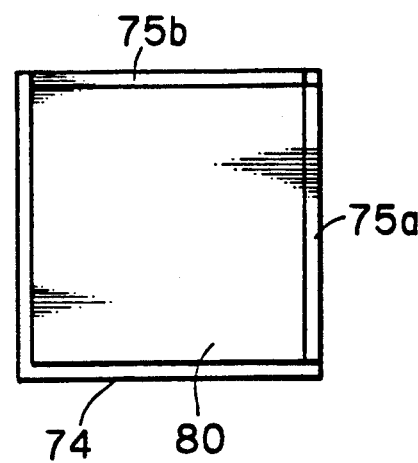
FIG. 13 is a plan view of the movable stage of the printing machine of FIG. 11.

On the other hand, on the movable stage 74, there are stoppers 75a and 75b, as shown in FIG. 13 also, extending in orthogonal relation to each other and serving as positioning means adapted to abut against the workpiece 80 to position the latter in a predetermined position.

The workpiece 80 is an alumina substrate, piezoelectric substrate or other substrate included in an electronic part.

The printing of the workpiece 80 is performed in the following procedure.

First, the screen printing plate 50 is installed on the fixing block 71 with the screen mesh 53 turned upward while applying weak forces to the screen printing plate 50 in the two directions of arrows G and H (see FIG. 12) until the positioning pins 52a through 52c abut against the positioning protuberances 72a through 72c. Thereby, it follows that the screen printing plate 50 has been accurately set on the fixing block 71.

When the screen printing plate 50 is to be accurately set on the fixing block 71, the screen printing plate 50 may be moved horizontally and downwardly with respect to the fixing block 71 and then the positioning pins 52a through 52c may be made to abut against the positioning protuberances 72a though 72c respectively.

Then, the workpiece 80 is positioned on the movable stage 74 so that it abuts against the stoppers 75a and 75b.

In this case, the distance $X_4$ in the X-axis direction between the front ends of the positioning protuberances 72a and 72b and the inner surface of the stopper 75a and the distance $Y_4$ (not seen in the figures) in the Y-axis direction between the front end of the positioning protuberance 72c and the inner surface of the stopper 75b are determined so that the screen printing plate 50 and the workpiece 80 which have respectively been set as described above are in a predetermined positional relation to each other.

Therefore, when the screen printing plate 50 and the workpiece 80 have been set in the printing machine 70 as described above, it follows that the master plate patterns 12 on the master plate 10 have been accurately positioned in a predetermined position relative to the workpiece 80.

In the above state, the movable stage 74 is lifted until the workpiece 80 is opposed to the lower surface of the screen printing plate 50 with a predetermined clearance (referred to as the screen distance, which is about 1 mm) defined therebetween, and printing is performed.

That is, with a required paste 77 applied to the upper surface of the screen printing plate 50, the squeegee 76 is moved in the direction of arrow I while pressing its edge against the screen mesh 53, thereby forcing the paste 77 out through the printing patterns 55 for printing.

In this case, in addition to the high positional accuracy (about $\pm 10$ $\mu$m) of the printing patterns 55 on the screen printing plate 50, the screen printing plate 50 can be accurately set on the fixing block 71 by the positioning means; therefore, if the workpiece 80 can be set always in the same position on the movable stage 74, it is possible to obtain a positional accuracy of about $\pm 10$ $\mu$m for the printing patterns 55 relative to the workpiece 80.

Furthermore, since it is no longer necessary to make trial printing as in the prior art, the time required for correcting the position of the screen printing plate 50 is reduced almost to zero. Further, said accuracy of about $\pm 10$ $\mu$m is a much better value than that obtained by making trial printing many times in the prior art.

Furthermore, according to the positioning means described above, since the reproducibility of positioning is high, said accuracy of about $\pm 10$ $\mu$m can be obtained whenever the screen printing plate 50 is worn out and has to be replaced by a new one or whenever the screen printing plate 50 is replaced by a new one whose printing patterns differ from those of the old one.

In addition, each of the sides of the fixing frame 20 and screen printing plate 50 where the positioning pins 22c and 52c are present, respectively, may be provided with another positioning pin whose front end surface is flush with that of the associated positioning pin; similarly, the positioning block 30, exposure system 60 and printing machine 70 may each be provided with another positioning pin.

Further, in the above example, the positioning pins 22a through 22c and 52a through 52c are cylindrical, and the positioning protuberances 32a through 32c, 62a through 62c, 63a through 63c, and 72a through 72c are hemispherical, but their shapes may be exchanged for each other.

The fixing frame 20 and screen printing plate 50 may be provided as positioning means with recesses having finished bottom surfaces, rather than with the positioning pins 22a through 22c and 52a through 52c in convex form, in the positions corresponding thereto, whereby the possibility of things hitting and damaging them is reduced. Particularly, the merit of such arrangement is high in the case of the screen printing plate since its frequency of being moved between processes is high.

In addition, the movable stage 74 has been shown as the lifting type; however, this movable stage may be constructed for horizontal movement.

Although the present invention has been described and illustrated in detail, it is clearly understood that the same is by way of illustration and example only and is not to be taken by way of limitation, the scope of the present invention being limited only by the terms of the appended claims.

What is claimed is:

1. A screen printing method comprising:
    (a) an aligning process including the steps of:
        (1) preparing
            (i) a master plate in the form of a transparent plate having formed on the surface thereof master plate patterns and positioning marks disposed in relative positional relation thereto,
            (ii) a quadrangular fixing frame for fixing said master plate and having two first positioning means on one of two adjoining sides and at least one second positioning means on the other side, the first and second positioning means each being in the form of a projection which protrudes laterally outward from said fixing frame, tips of the first positioning means being located substantially in a plane which is substantially parallel to said one side and orthogonal to said frame, and a tip of the second positioning means being located in a plane which is orthogonal both to said fixing frame and to said last-mentioned plane,
            (iii) a positioning block adapted to mount said fixing frame thereon, said positioning block having a plurality of third positioning means which are in the form of projections which protrude laterally from said positioning block so as to abut respectively against said first and second positioning means of said fixing frame and thereby position said fixing frame in a predetermined position, and
            (iv) a sight for ascertaining that the master plate on the fixing frame has been positioned in a predetermined position,
        (2) placing the fixing frame, with the master plate provisionally fixed thereto, on the positioning block in such a manner that said first and second positioning means abut against said third positioning means,
        (3) positioning the master plate by using the sight so that the positioning marks on the master plate are positioned in a predetermined position, and
        (4) thereafter effecting the final fixing of the master plate on the fixing frame;
    (b) an exposure process comprising the steps of:
        (1) preparing a screen printing plate which has not yet undergone complete plate making, said screen printing plate having a screen mesh spread on a quadrangular plate frame with a photosensitive film applied to said screen mesh, said plate frame having two fourth positioning means on one of two adjoining sides and at least one fifth positioning means on the other side, the fourth and fifth positioning means each being in the form of a projection which protrudes laterally outward from said plate frame, tips of the fourth positioning means being located substantially in a plane which is substantially parallel to said one side and orthogonal to said plate frame, and a tip of the fifth positioning means being located in a plane which is orthogonal both to said plate frame and to said last-mentioned plane, (2) preparing an exposure system having a plurality of sixth positioning means adapted to abut against the first and second positioning means of the fixing frame having the master plate fixed thereto for positioning said fixing frame in a predetermined position, and a plurality of seventh positioning means adapted to abut against the fourth and fifth positioning means of the screen printing plate to position said screen printing plate in a predetermined position, (3) attaching said fixing frame with the master plate fixed thereto and said screen printing plate to the exposure system in such a manner that their first, second, fourth and fifth positioning means abut against the sixth and seventh positioning means of said exposure system, and (4) performing exposure of said screen printing plate through the master plate;

(c) a developing process which includes developing the screen printing plate, which has been exposed; and (d) a printing process comprising the steps of:
(1) preparing a printing machine having a plurality of eighth positioning means adapted to abut against the fourth and fifth positioning means of the screen printing plate to position the screen printing plate in a predetermined position,
(2) attaching the screen printing plate, which has been developed, to the printing machine in such a manner that its fourth and fifth positioning means abut against the eighth positioning means of said printing machine, and
(3) performing printing of a workpiece.

2. A screen printing method as set forth in claim 1, wherein said workpiece is a substrate to be included in an electronic part.

3. A screen printing method as set forth in claim 1, wherein said positioning marks are crisscross.

4. A screen printing method as set forth in claim 1, wherein said exposure system includes a second sight for ascertaining the positions of the positioning marks, and said exposure process includes the step of finely adjusting the position of said master plate by using said second sight.

5. A method of producing a screen printing plate, comprising:

(a) an aligning process including the steps of:
(1) preparing
a master plate in the form of a transparent plate having formed on the surface thereof master plate patterns and positioning marks disposed in relative positional relation thereto,
a quadrangular fixing frame for fixing said master plate and having two first positioning means on one of two adjoining sides and at least one second positioning means on the other side, the first and second positioning means each being in the form of a projection which protrudes laterally outward from said fixing frame, tips of the first positioning means being located substantially in a plane which is substantially parallel to said one side and orthogonal to said frame, and a tip of the second positioning means being located in a plane which is orthogonal both to said fixing frame and to said last-mentioned plane, and
a positioning block adapted to mount said fixing frame thereon, said positioning block having a plurality of third positioning means which are in the form of projections which protrude laterally from said positioning block so as to abut respectively against said first and second positioning means of said fixing frame and thereby position said fixing frame in a predetermined position, and
a sight for ascertaining that the master plate on the fixing frame has been positioned in a predetermined position,
(2) placing the fixing frame, with the master plate provisionally fixed thereto, on the positioning block in such a manner that said first and second positioning means abut against said third positioning means,
(3) positioning the master plate by using the sight so that the positioning marks on the master plate are positioned in a predetermined position, and
(4) thereafter effecting the final fixing of the master plate on the fixing frame;

(b) an exposure process comprising the steps of:
(1) preparing a screen printing plate which has not yet undergone complete plate making, said screen printing plate having a screen mesh spread on a quadrangular plate frame with a photosensitive film applied to said screen mesh, said plate frame having two fourth positioning means on one of two adjoining sides and at least one fifth positioning means on the other side, the fourth and fifth positioning means each being in the form of a projection which protrudes laterally outward from said plate frame, tips of the fourth positioning means being located substantially in a plane which is substantially parallel to said one side and orthogonal to said plate frame, and a tip of the fifth positioning means being located in a plane which is orthogonal both to said plate frame and to said last-mentioned plane,
(2) preparing an exposure system having a plurality of sixth positioning means adapted to abut against the first and second positioning means of the fixing frame having the master plate fixed thereto for positioning said fixing frame in a predetermined position, and a plurality of seventh positioning means adapted to abut against the fourth and fifth positioning means of the screen printing plate to position said screen printing plate in a predetermined position,
(3) attaching said fixing frame with the master plate fixed thereto and said screen printing plate to the exposure system in such a manner that their first, second, fourth and fifth positioning means abut against the sixth and seventh positioning means of said exposure system, and
(4) performing exposure of said screen printing plate through the master plate; and (c) a developing process for developing the screen printing plate, which has been exposed.

* * * * *